(12) United States Patent
Reinker

(10) Patent No.: US 8,182,104 B2
(45) Date of Patent: May 22, 2012

(54) CAPACITIVE PROXIMITY AND/OR TOUCH SWITCH

(75) Inventor: Bernward Maria Reinker, Regenstauf (DE)

(73) Assignee: BSH Bosch und Siemens Hausgeraete GmbH, Munich (DE)

( * ) Notice: Subject to any disclaimer, the term of this patent is extended or adjusted under 35 U.S.C. 154(b) by 280 days.

(21) Appl. No.: 12/674,806

(22) PCT Filed: Sep. 5, 2008

(86) PCT No.: PCT/EP2008/061727
§ 371 (c)(1),
(2), (4) Date: Feb. 23, 2010

(87) PCT Pub. No.: WO2009/037131
PCT Pub. Date: Mar. 26, 2009

(65) Prior Publication Data
US 2010/0276268 A1  Nov. 4, 2010

(30) Foreign Application Priority Data

Sep. 18, 2007 (DE) .......................... 10 2007 044 393

(51) Int. Cl.
*H01H 9/00* (2006.01)
(52) U.S. Cl. ....... 362/97.1; 362/276; 200/313; 200/317; 200/600
(58) Field of Classification Search .................. 362/97.1, 362/97, 4, 276, 395, 802; 200/310, 313, 200/314, 317, 600; 345/173, 174, 176; 361/288
See application file for complete search history.

(56) References Cited

U.S. PATENT DOCUMENTS

| 5,512,718 | A | * | 4/1996 | Larose | 200/314 |
| 5,521,345 | A | * | 5/1996 | Wulc | 200/317 |
| 5,892,652 | A | | 4/1999 | Bony et al. | |
| 5,917,165 | A | | 6/1999 | Platt et al. | |
| 6,664,489 | B2 | * | 12/2003 | Kleinhans et al. | 200/313 |
| 2002/0167704 | A1 | | 11/2002 | Kleinhans et al. | |
| 2003/0210537 | A1 | | 11/2003 | Engelmann | |

FOREIGN PATENT DOCUMENTS

| DE | 19528821 A1 | 2/1997 |
| DE | 69602161 T2 | 10/1999 |
| DE | 10352681 A1 | 6/2005 |
| EP | 0859467 A1 | 8/1998 |
| EP | 1257057 A1 | 11/2002 |
| EP | 1376872 A2 | 1/2004 |
| EP | 1732224 A1 | 12/2006 |

* cited by examiner

*Primary Examiner* — Thomas Sember
(74) *Attorney, Agent, or Firm* — James E. Howard; Andre Pallapies

(57) ABSTRACT

A capacitive proximity and/or touch switch has an electrically conductive body bridging a spacing distance between an at least partially translucent, electrically insulating cover plate and a carrier plate. The electrically conductive body has a sensor surface at the end thereof facing the cover plate. The sensor surface is connected to an evaluation circuit via the electrically conductive body. A light source is associated with the sensor surface, the light of which implements an optical display in an operating region defined by the sensor surface at the front of the cover plate. The light source is disposed at an offset to the position of the operating region, and the electrically conductive body has a reflector region configured such that light emitted from the light source can be deflected in the direction of the operating region by the reflector region.

16 Claims, 3 Drawing Sheets

CAPACITIVE PROXIMITY AND/OR TOUCH SWITCH

BACKGROUND OF THE INVENTION

Field of the Invention

The invention relates to a capacitive proximity and/or touch switch, having an electrically conductive body bridging the distance between an at least partially translucent, electrically insulating cover plate and a carrier plate, wherein the electrically conductive body has a sensor surface at its end facing the cover plate, said sensor surface being connected to an evaluation circuit by way of the electrically conductive body, and wherein a light source is associated with the sensor surface, the light of which realizes an optical display in an operating region defined by the sensor surface on the front face of the cover plate.

Such a capacitive proximity or touch switch is already known from EP 0 859 467 B1. Here an electrically conductive plastic body bridges the distance between a printed circuit board and the glass ceramic plate of a hob. The surface of the plastic body resting against the lower face of the glass ceramic plate forms the sensor surface. At its other end the plastic body rests against an electrical contact surface of the printed circuit board. In particular this plastic body can have a central hole, in which a light-emitting diode is arranged. This LED marks the operating region defined by the sensor surface on the upper face of the glass ceramic plate optically, in that it is permanently lit or indicates switching states by illuminated signs.

In DE 696 02 161 T2 the electrically conductive body is in the form of a leaf spring, bent in the form of a Z. This leaf spring consists of a base plate, which is secured to the carrier plate, and an upper plate, which can be pushed against the lower face of the cover plate arranged parallel to the carrier plate, forming the sensor surface there. The base plate and the upper plate form the two ends of the Z, which are connected to one another by a central, angled part of the Z. This angled part gives the leaf spring flexibility so that it is possible for the leaf spring to compensate for deviations in parallelity between the carrier plate and the cover plate.

BRIEF SUMMARY OF THE INVENTION

The object of the present invention is to provide an improved capacitive proximity and/or touch switch.

The object is achieved by the features of claim 1.

With a capacitive proximity and/or touch switch of the type mentioned in the introduction an electrically conducting sensor surface is covered by an at least partially translucent, electrically insulating cover plate and in accordance with a known principle forms an electrode of a capacitor, the capacitance of which can be changed by proximity to or contact with the cover plate, which can be evaluated by means of an evaluation circuit. In other words the dielectric cover plate serves as a touch or proximity surface of the capacitive proximity and/or touch switch, an operating region on the surface of the cover plate being defined by the position of the sensor surface. Arranged between the cover plate and a carrier plate arranged at a distance from this, which can in particular be a printed circuit board, is an electrically conductive body, by way of which the sensor surface is connected to the evaluation circuit.

In other words the capacitive proximity and/or touch switch is operated for example by a human finger touching the cover plate in the position of the operating region or at least approaching it, so that the capacitance of the capacitor formed by the finger and sensor surface changes in a measurable manner. This change can be detected by the evaluation circuit, so that actuation of the switch can be evaluated and/or converted.

With such a capacitive proximity and/or touch switch according to the invention a light source is disposed at an offset to the position of the operating region and the electrically conductive body has a reflector region configured in such a manner that light emitted from the light source can be deflected in the direction of the operating region by the reflector region. In other words, to identify the position of the operating region and/or to identify switching states of the switch for the user, the light emitted from the light source is deflected by way of the reflector region of the electrically conductive body to the position of the operating region and emitted through the cover plate, which is at least partially translucent in this position. The light here can vary depending on the switching state, for example in color or by light signals of varying length. The electrically conductive body therefore has a double function: on the one hand it establishes the electrical connection between the sensor surface disposed in the region of the operating surface and an electrical evaluation circuit and on the other hand it comprises the reflector region, by means of which light radiated in laterally is deflected in the direction of the operating region so that the operating region is illuminated in a user-friendly manner.

When the reflector region is shaped correspondingly, the light radiated laterally onto the electrically conductive body is reflected correspondingly and deflected onto the surface of the cover plate in the actuation region for the capacitive proximity and/or touch switch. It is thus possible to achieve regular illumination of the operating region in a simple manner. It is also possible to avoid positioning electronic light sources within the region of the sensor surface and thus influencing the sensor signal with such potential interference sources. When there is a small distance between the carrier plate and the cover plate, in particular when the distance is too small for an active light-emitting component, illumination of the operating region is also possible in that light is radiated onto the reflector region laterally between the carrier plate and the cover plate, for example by way of a correspondingly dimensioned optical waveguide. Selecting the lateral distance between the light source and the reflector region of the electrically conductive body determines the light distribution on arrival at the reflector region. It is thus possible to achieve homogenous illumination of the operating region by corresponding selection of this distance, even when there is little available height for fitting the proximity and/or touch switch.

The light source, which is for example an active component, such as a light-emitting diode, or a passive component, for example an optical waveguide, is preferably disposed on the carrier plate. A number of light sources would also be conceivable, in particular emitting different light, in different colors for example. According to one preferred embodiment the light source is aligned so that it emits its light essentially parallel to the carrier plate and/or the cover plate. In other words the light emitted from the light source is propagated in the intermediate space between the carrier plate and cover plate, in a direction along the carrier plate and/or cover plate.

According to a further embodiment of the invention provision is made for an optical means to be disposed between the light source and the reflector region to change the light from the light source. In particular the light is to be scattered, filtered, colored, bundled or changed in some other way in a predefinable manner. The optical element here can be disposed like the actual light source at a lateral offset to the electrically conductive body and can therefore be integrated in a manner that is economical in respect of space without increasing the distance between the cover plate and carrier plate.

The reflector region can extend from the cover plate or sensor surface to the carrier plate. The reflector region here can be configured in the form of a curved, straight or any shape of path. The electrically conductive body is preferably configured in the form of a 7 (seven). The sensor surface here corresponds to the upper end of the 7 and the reflector region to the angled part of the 7, which bridges the distance between the cover plate and the carrier plate.

The reflector region is disposed in particular at an acute angle to the sensor surface. This means that light, which is emitted from the light source along the carrier plate or cover plate or sensor surface and strikes the reflector region, is deflected by this in the direction of the sensor surface and therefore in the direction of the operating region.

In one advantageous embodiment of the invention the reflector region is roughened or coated to generate a diffuse beam element. This causes light coming from the light source to be broken or dulled in order to illuminate the entire region of the sensor surface or operating region homogeneously and with regular luminous intensity.

In a further advantageous embodiment of the invention the reflector region has an essentially metallic surface, which is configured to reflect the incident light in a specific manner with a predefinable form. The metallic surface serves as an economical reflector, it being possible in principle also to use any other material suitable for reflecting purposes. The reflector can assume a predefinable shape in order to be able to configure the illumination in the desired manner in the region of the sensor surface or operating region. Suitable shaping for example allows the light from an essentially point-type light source to be distributed homogeneously over the surface to be illuminated.

In one particularly economical embodiment the electrically conductive body is configured as a single piece. This allows the number of components of the proximity and/or touch switch to be minimized.

In a further advantageous embodiment of the invention the electrically conductive body is configured in the form of a leaf spring made of an electrically conductive material, at least part of the surface of which forms the reflector region. This leaf spring can push against the cover plate and/or carrier plate with a predefinable pretensioning. This ensures that the sensor surface rests against an electrical contact surface of the carrier plate, which is in particular a printed circuit board, at the rear face of the cover plate or the end of the leaf spring facing away from the cover plate. The spring as a whole can at the same time be used as a reflector region, to allow the fullest possible deflection of the incident light in the direction of the sensor surface or operating region.

According to one particularly advantageous embodiment the end of the electrically conductive body with the sensor surface is configured in the manner of a frame and the reflector region is disposed in such a manner in relation to this frame that the light deflected by the reflector region passes through the frame. This allows an optical display within the operating region defined by the sensor surface even though the light source is disposed at a lateral offset to the electrically conductive body or the sensor surface.

The electrical body is preferably a stamped part, with the reflector region being bent away from the end defining the sensor surface. This allows the electrically conductive body to be manufactured from a flat metal sheet by stamping and bending. For example it is manufactured from an essentially rectangular flat element, the sensor surface being defined by the outer edges of said rectangle. In one stamping process it is possible to separate a smaller, inner rectangle enclosed by the sensor surface from the outer rectangle, i.e. the sensor surface, at three of the four rectangle sides, so that the connection only exists by way of the fourth, unstamped side. This inner rectangle can thus be pushed to a degree out of the plane defined by the sensor surface. The inner rectangle bridges the distance between the cover plate and the carrier plate (FIG. 1 will illustrate this). The surface of the inner rectangle serves as the reflector region for the light emitted from the light source. The inner rectangle is connected in a sprung manner to the sensor surface by way of the remaining common edge, so that the electrically conductive body can be mounted with a spring tension between the cover plate and the carrier plate.

The electrically conductive body can be fixed between the cover plate and the carrier plate in varying ways. For example it is simply fixed in position by a clamping tension. Another possibility is to connect the electrically conductive body to the cover plate by its sensor surface, for example by adhesion to the rear face of the cover plate or injection into the cover plate. In another variant the end of the electrically conductive body facing away from the cover plate is fixed to the carrier plate, for example by adhesion, soldering or latching. It is also possible to dispose a light box between the cover plate and the carrier plate, to fix the electrically conductive body in its intended position. In this process the components involved, i.e. light box, carrier plate, cover plate and electrically conductive body, can again be connected to one another in varying ways, e.g. adhesion, latching, injection, etc. The light box preferably has latching elements, by means of which it can be latched to counter-latching elements of the carrier plate and/or cover plate. The electrically conductive body can rest against the light box with its sensor surface for example, be clamped between the light box and cover plate or be latched by its own latching elements to counter-latching elements of the light box.

A domestic appliance, for example a washing machine, laundry dryer, dishwasher, cooking appliance, extractor hood, air conditioning unit, water heater or vacuum cleaner, or an input field for a domestic appliance is preferably equipped with at least one inventive proximity and/or touch switch. The domestic appliance can thus be equipped with a continuous panel encompassing the input field, so that the domestic appliance is protected against an ingress of dirt or moisture. The panel here corresponds to the electrically insulating cover plate and can be made for example of glass, glass ceramic, ceramic, plastic, wood or stone. The panel can be flat or raised.

It should be noted that the features of the subclaims can be combined with one another in any manner without departing from the inventive concept.

The invention is described in more detail below with reference to drawings, in which:

DESCRIPTION OF THE INVENTION

Figure 1:
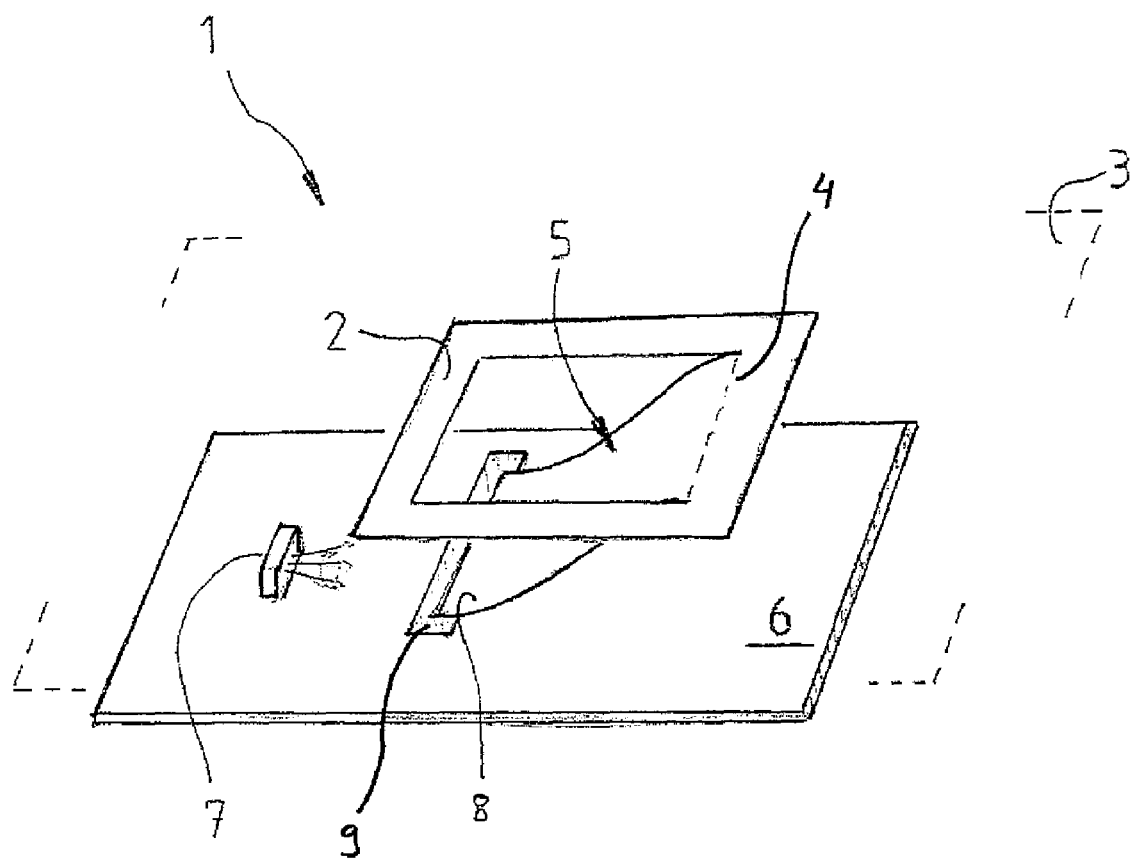
FIG. 1 shows a perspective and schematic view of an inventive proximity and/or touch switch.

Before examining the drawings in more detail, it should be noted that corresponding or identical elements or individual parts in the various embodiments of the capacitive proximity and/or touch switch according to the invention are identified with the same reference characters in all the figures.

FIG. 1 shows a perspective view of a capacitive proximity and/or touch switch 1. The switch 1 here comprises an electrically conductive body 4, having a sensor surface 2 at its end facing a cover plate 3 shown with a broken line. The electrically conductive body 4 is configured as a leaf spring in the shape of a seven and extends from the cover plate 3 to a carrier plate 6. The end 8 of the electrically conductive body 4 facing away from the sensor surface 2 rests against the carrier plate 6 at a contact surface 9 of the carrier plate 6, which is in particular a printed circuit board. The electrically conductive body 4 and therefore the sensor surface 2 are connected electrically by way of this contact surface 9 to an evaluation circuit and in some instances downstream appliance controller (not shown). The electrically conductive body 4 has a reflector region 5 from the sensor surface 2 to its end 8 facing away from the sensor surface 2.

A light source 7 is disposed on the carrier plate 6 at a lateral offset to the electrically conductive body 4 and therefore also at an offset to the sensor surface 2 and can be for example a light-emitting diode or one end of an optical waveguide. This light source 7 emits light, which is propagated along the carrier plate 6 or cover plate 3 in the direction of the electrically conductive body 4 or its reflector region 5. The reflector region 5 is at an acute angle to the sensor surface 2 so that the light from the light source 7, which strikes the reflector region 5, is reflected, i.e. deflected, in the direction of the sensor surface 2. The sensor surface 2 is configured in the manner of a frame, so that the light reflected by the reflector region 5 can pass through the frame and is thus visible to an observer B through the translucent cover plate 3.

The electrically conductive body 4 is manufactured from a flat metal sheet by stamping and bending. A smaller rectangle lies within an outer rectangle so that the frame-type sensor surface 2 is formed by the surface between the outer edges of both rectangles. The inner small rectangle is separated from the outer rectangle on three of the four rectangle sides and bent out of the plane formed by the sensor surface 2. This inner small rectangle bridges the distance between the cover plate 3 and the carrier plate 6 and forms the reflector region 5 of the electrically conductive body 4.

Figure 2:
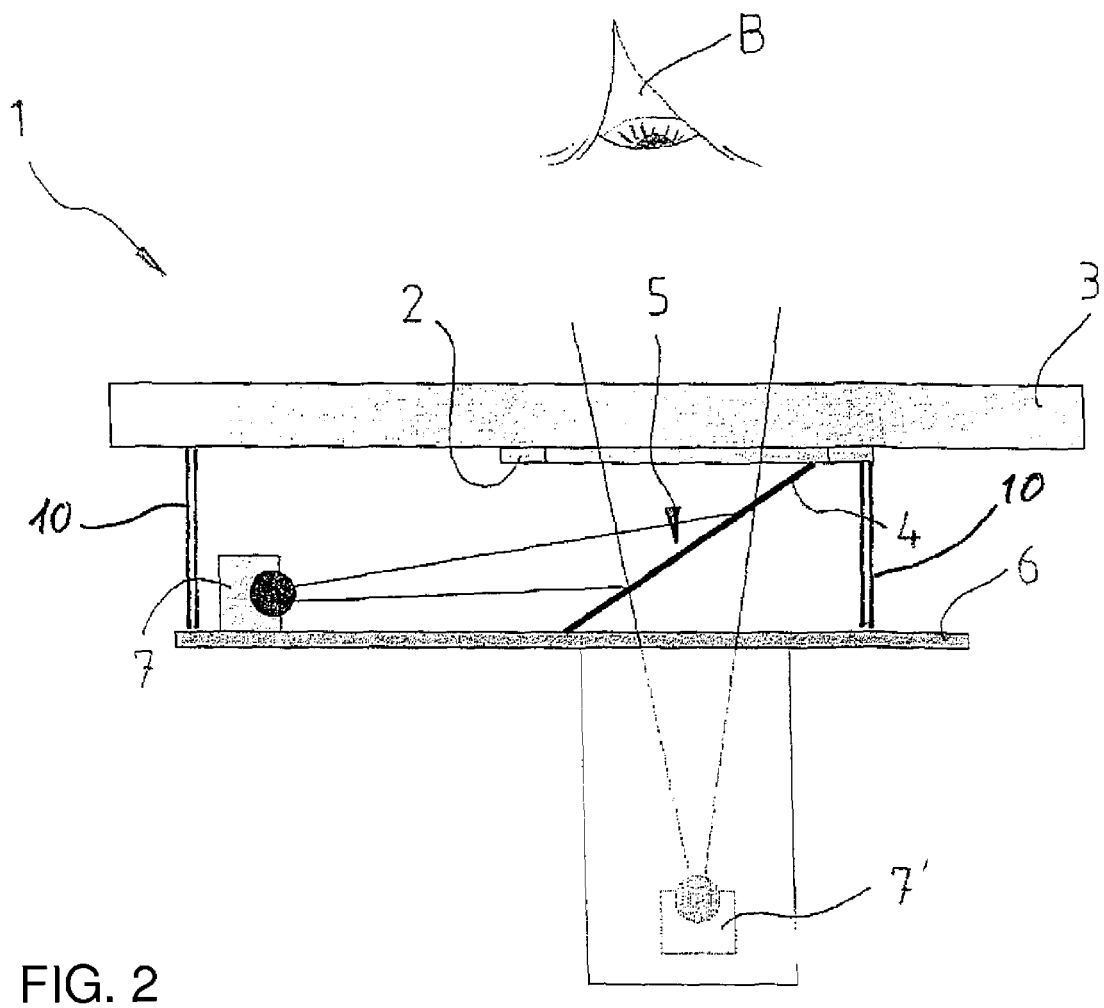
FIG. 2 shows a schematic side view of the switch according to FIG. 1 with a first reflector profile.

FIG. 2 explains the light conditions at the proximity and/or touch switch according to FIG. 1. The light radiated in laterally from the light source 7 in the direction of the reflector region 5 is reflected by this in the direction of the operating surface 3 and, because the cover plate 3 is configured as translucent at least in the region of the sensor surface 2, can be perceived correspondingly by an observer B. Since the path taken by the light from the light source 7 by way of the reflector region 5 to the cover plate 3 is greater than the distance between the carrier plate 6 and cover plate 3, a similar light distribution is achieved for the observer B to that which would be achieved, were a virtual light source 7' disposed in a straight elongation from the sensor surface 2 to the carrier plate below the carrier plate 6. By selecting the lateral distance between the light source 7 and the reflector region 5 it is possible to change the light distribution correspondingly, while at the same time allowing little height for fitting the proximity and/or touch switch 1.

So that the light emission remains restricted to the operating region of the proximity and/or touch switch 1, a light box 10 is provided, which encloses the electrically conductive body 4 and the light source 7. This restricts the extension of the light emitted from the light source 7 to the light box 10. The light box 10 also serves to fix the electrically conductive body 4 in position on the rear face of the cover plate 3. The sensor surface 2 of the electrically conductive body 4 rests against the light box 10 and is pushed by it against the rear face of the cover plate 3.

Figure 3:
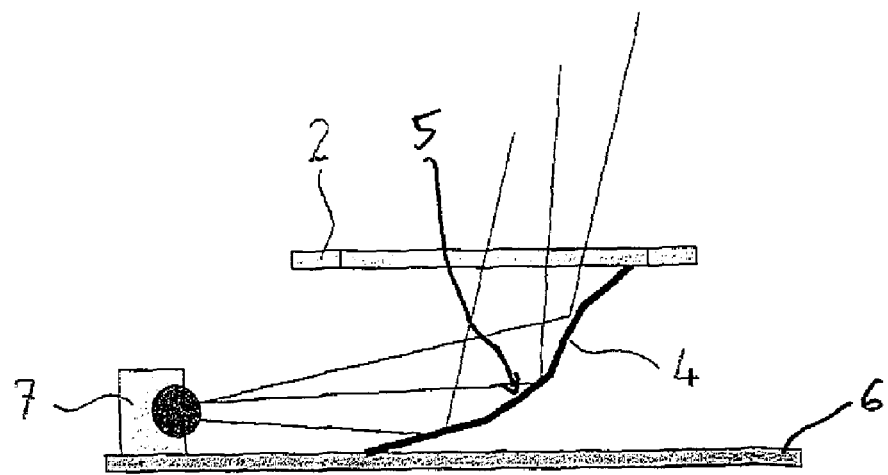
FIG. 3 shows a schematic side view of the switch according to FIG. 1 with a second reflector profile.
Figure 4:
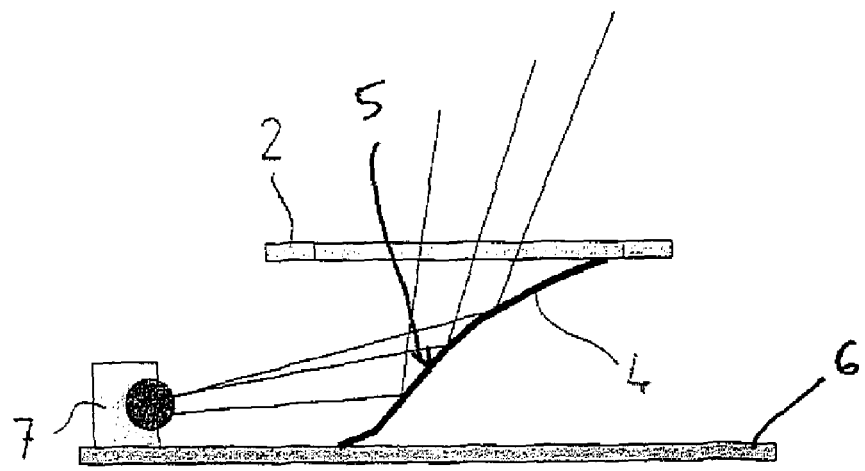
FIG. 4 shows a schematic side view of the switch according to FIG. 1 with a third reflector profile.

FIGS. 3 and 4 show how it is possible with reflector regions 5 of varying shapes to deflect the light from the light source 7 as required to produce different optical impressions. In FIG. 3 the reflector region 5 is curved in a convex manner in relation to the sensor surface 2 so that the light reflected by the reflector region is bundled. In FIG. 4 the reflector region 5 is curved in a concave manner in relation to the sensor surface 2 so the opposite effect is achieved, i.e. the reflected light is diffused.

LIST OF REFERENCE CHARACTERS

1 Capacitive proximity and/or touch switch
2 Sensor surface
3 Cover plate
4 Electrically conductive body
5 Reflector region
6 Carrier plate
7 Light source
8 End of electrically conductive body facing away from the cover plate
9 Contact surface of carrier plate
10 Light box
B Observer

The invention claimed is:

1. A capacitive proximity and/or touch switch, comprising:
   an at least partially translucent, electrically insulating cover plate, said cover plate having a front face;
   a carrier plate disposed a spacing distance from said cover plate;
   an electrically conductive body bridging said distance between said cover plate and said carrier plate, said electrically conductive body having a reflector region;
   said electrically conductive body having a sensor surface at an end facing said cover plate, said sensor surface being connected to an evaluation circuit by way of said electrically conductive body;
   a light source associated with said sensor surface, said light source outputting light implementing an optical display in an operating region on said front face of said cover plate defined by said sensor surface;
   said light source being disposed at an offset from the operating region and being disposed to emit and radiate light along said carrier plate and/or said cover plate; and
   wherein said reflector region of said electrically conductive body is configured to deflect light radiated in laterally from said light source in a direction toward said operating region.

2. The switch according to claim 1, wherein said light source is mounted to said carrier plate.

3. The switch according to claim 1, which comprises an optical device disposed between said light source and said reflector region, configured to change the light emitted from said light source.

4. The switch according to claim 3, wherein said optical device is configured to scatter, filter, color, or bundle the light from the light source.

5. The switch according to claim 1, wherein said reflector region extends from said cover plate to said carrier plate.

6. The switch according to claim 1, wherein said reflector region is disposed at an acute angle relative to said sensor surface.

7. The switch according to claim 1, wherein said reflector region is formed by a roughened or coated surface to generate a diffuse beam element.

8. The switch according to claim 1, wherein said reflector region has a metallic surface configured to reflect the light incident thereon in a specific manner with a predefinable form.

9. The switch according to claim 1, wherein said electrically conductive body is configured as a single piece.

10. The switch according to claim 1, wherein said electrically conductive body is a leaf spring made of electrically conductive material, and wherein at least a portion of a surface of said leaf spring forms said reflector region.

11. The switch according to claim 1, wherein an end of said electrically conductive body with said sensor surface is formed as a frame and said reflector region is disposed relative to said frame to cause the light deflected by said reflector region to pass through said frame.

12. The switch according to claim 1, wherein said electrically conductive body is a stamped part and said reflector region is bent away from an end defining said sensor surface.

13. The switch according to claim 12, wherein the end of said electrically conductive body defining said sensor surface rests against a rear face of said cover plate.

14. The switch according to claim 12, wherein the end of said electrically conductive body defining said sensor surface is integrated in said cover plate.

15. A domestic appliance, comprising a switch according to claim 1.

16. An electrically conductive body for the switch according to claim 1.

* * * * *